United States Patent [19]
Kim et al.

[11] Patent Number: 6,075,736
[45] Date of Patent: Jun. 13, 2000

[54] SEMICONDUCTOR MEMORY DEVICE WITH IMPROVED SENSE AMPLIFIER DRIVER

[75] Inventors: Ha-Soo Kim, Seoul; Jae-Goo Lee, Kwangmyung; Chang-Man Khang, Seoul; Tae-Hyoung Kim, Koonpo, all of Rep. of Korea

[73] Assignee: LG Semicon Co., Ltd., Cheongju, Rep. of Korea

[21] Appl. No.: 09/179,564

[22] Filed: Oct. 27, 1998

[30] Foreign Application Priority Data

Nov. 8, 1997 [KR] Rep. of Korea ............... 97-58890

[51] Int. Cl.[7] ........................................ G11C 7/02
[52] U.S. Cl. ................ 365/207; 365/205; 365/208; 365/230.03
[58] Field of Search ........................... 365/207, 205, 365/208, 230.03

[56] References Cited

U.S. PATENT DOCUMENTS

| | | | |
|---|---|---|---|
| 5,053,998 | 10/1991 | Kannan et al. | 365/194 |
| 5,267,203 | 11/1993 | Hwang et al. | 365/190 |
| 5,555,523 | 9/1996 | Haga et al. | 365/203 |
| 5,590,080 | 12/1996 | Hasagawa et al. | 365/201 |
| 5,594,695 | 1/1997 | Yim et al. | 365/205 |
| 5,822,261 | 10/1998 | Suh | 365/207 |

OTHER PUBLICATIONS

ISSCC96/Session 23/DRAM/PAPER SP 23.6 A 32–Bank 1Gb DRAM with 1GB/s Bandwidth.

*Primary Examiner*—Richard T. Elms
*Assistant Examiner*—Hien Nguyen

[57] ABSTRACT

The semiconductor memory according to the present invention employs a plurality of sense amplifier drivers which individually control the sense amplifiers, or control groups of sense amplifiers, in the semiconductor memory. More specifically, the sense amplifier drivers control whether associated sense amplifiers are connected to sense amplifier array input/output lines. In this manner fewer sense amplifiers are connected to the sense amplifier array input/output lines, reducing overall current consumption.

25 Claims, 9 Drawing Sheets

SEMICONDUCTOR MEMORY DEVICE WITH IMPROVED SENSE AMPLIFIER DRIVER

BACKGROUND OF THE INVENTION

1. Field of the Invention

The present invention relates to a semiconductor memory, and more particularly to a sense amplifier control circuit for a semiconductor memory device.

2. Description of Conventional Art

FIG. 1 illustrates the construction of a conventional semiconductor memory. As shown therein, the semiconductor memory includes a plurality of cell arrays, i, j, k, l, m, . . . in which data are recorded; a plurality of word line drivers (only one of which has been illustrated for the sake of clarity) which receive an input row address and drive a corresponding word line; a plurality of sense amplifier (amp) arrays . . . , S/Ai, S/Aj, S/Ak, S/Al, S/Am, . . . , each of which is formed of a plurality of sense amps amplifying the data loaded in the word line which has been driven; a column decoder which decodes an input column address identifying the column of a selected memory cell and outputs a column address selecting signal YSEL; a column block decoder which generates a column block selecting signal . . . , CBSELi, . . . ,CBSELm, . . . to select a specific block or memory cell array based on a bank address in the memory address; S/A local input/output lines . . . , SAIOi, . . . ,SAIOm, . . . and inverse S/A local input/output lines . . . , SAIOBi, . . . ,SAIOBm, . . . ; data bus input/output lines DBIO1, DBIO0B, DBIO1, DBI01B which transmit the data loaded in the selected word line and bit line; and a plurality of switches . . . , SWi, SWBi, . . . , SWm, SWBm, . . . for selectively connecting corresponding S/A and inverse S/A local input/output lines SAIO and SAIOB with data bus lines DBIO and DBIOB in accordance with the column block selecting signals CBSELs.

FIG. 2 illustrates a circuit diagram of a sense amplifier SA in a sense amplifier array S/A in FIG. 1. As shown, the sense amp SA includes a bit line connecting circuit 10 for connecting the bit line BL0 and the bit bar line BL0B (also known as a complementary bit line) to the S/A and inverse S/A local input/output lines SAIO and SAIOB, respectively, in response to the column address selecting signal YSEL for a column corresponding to the sense amp SA. The bit line connecting circuit 10 includes a first NMOS transistor MN1 having its drain connected to the bit line BL0, its source connected to the S/A local input/output line SAIO and its gate receiving the column address selecting signal YSEL. A second NMOS transistor MN2 has its drain connected to the bit bar line BL0B, its source connected to the inverse S/A local input/output line SAIOB and its gate receiving the column address selecting signal YSEL. Together, the first and second NMOS transistors MN1 and MN2 are commonly referred to as a Y-gate.

With reference to the accompanying drawings, the operation of the thus constructed conventional semiconductor memory will be described. Operation will be described for the case of writing or reading data in a memory cell having a memory address P. When a word line driver for a row in the kth memory cell array, which contains the memory cell with address P, is driven based on a row address signal (/RAS signal), a couple of sense amps SAk,m and SAl,m adjacent to the kth cell array, operate and load data in corresponding bit and bit bar lines (SAk,m represents the sense amp in the kth sense amp array and in the mth column position).

Next, when the column operation is initiated, the mth column address selecting signal mYSEL is driven by the column decoder, and accordingly first and second transistors MN1, MN2 (FIG. 2) in each of the sense amps SAs in the mth column are turned on and connect a corresponding bit and bit bar line with the S/A and inverse S/A local input/output lines SAIO and SAIOB.

Also, the kth column block selecting signal CBSELk is driven by the column block decoder, and accordingly the kth and Ith S/A and inverse S/A local input/output lines SAIOk, SAIOBk, SAIOI and SAIOBI are connected with the data bus lines DBIO1, DBIO1B, DB100 and DB100B via the selected switches SWk, SWBk, SWI, SWBI. As shown in FIG. 1, even though only the kth column block selecting signal CBSELk goes high, an OR-gate network distributes the kth column block selecting signal CBSELk to both the corresponding kth memory cell array and the subsequent Ith memory cell array. Consequently, the kth switches SWk and SWBk corresponding to both the kth memory cell array and the kth sense amp array S/Ak and the Ith switches SWI and SWBI corresponding to both the Ith memory cell array and the Ith sense amp array S/Al connect the S/A and inverse S/A local input/output lines SAIO and SAIOB with the data bus lines DBIO and DBIOB.

Since the mth column address selecting signal mYSEL is directly connected with the first and second transistors MN1 and MN2 of the sense amps SA in the mth column as shown in FIG. 2, all of these sense amps operate. However, only the kth and Ith switches SWk, SWBk, SWI, and SWBI are selected by the kth column block selecting signal CBSELk; and therefore, each of the S/A and inverse S/A local input/output lines SAIO and SAIOB for the sense amps other than sense amps SAk,m and SAl,m are not connected with the data bus input/output lines DBIO and DBIOB.

In the above-described conventional system, since the column address selecting signal mYSEL is commonly connected with the first and second NMOS transistors MN1 and MN2 of the sense amps SAs in that column, even in the event of reading or writing the data in the cell array k, all the sense amps SA in the mth column turn on.

Thus, for example, the sense amps SAi,m, SAj,m, SAk,m, SAl,m and SAm,m transmit data to the corresponding S/A and inverse S/A local input/output lines SAIO and SAISOB; thereby consuming an unnecessary amount of current. Furthermore, if for some reason the sense amps SAs do not operate, precharge voltages of the bit line and data line collide with each other and current consumption occurs. Particularly, as the capacity of a memory becomes larger, current consumption becomes greater. In addition, as loading of the column address selecting signal becomes greater in accordance with the increase in memory capacity, a rise and fall time of the column address selecting signal decreases and the speed of the memory is reduced. Therefore, considerable amounts of current are consumed.

SUMMARY OF THE INVENTION

One object of the present invention is to provide a semiconductor memory which overcomes the disadvantages and problems of the conventional art.

Another object of the present invention is to provide a semiconductor memory which does not consume current unnecessarily.

A further object of the present invention is to provide a semiconductor memory including sense amplifier drivers which control operation of corresponding sense amplifiers.

These and other objects are achieved by providing a semiconductor memory device, comprising: a plurality of memory cell arrays; a sense amplifier array corresponding to each memory cell array, each sense amplifier array including a plurality of sense amplifiers, each sense amplifier associated with a column of memory cells in a corresponding memory cell array and including a bit line and a bit bar line, the bit and bit bar lines for loading data stored in a memory cell; input/output lines corresponding to each sense amplifier array; a plurality of sense amplifier drivers, each sense amplifier driver associated with at least one sense amplifier and selectively connecting the bit and bit bar lines of the associated sense amplifier with the corresponding input/output lines based on at least one of a main column address selecting signal and an inverse of the main column address selecting signal and at least one of a column group selecting signal and an inverse of the column group selecting signal; a column decoder decoding a column address signal, indicating a column address of a selected memory cell, to generate the main column address selecting signal; and a decoder generating the column group selecting signal indicating at least a memory cell array containing the selected memory cell.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
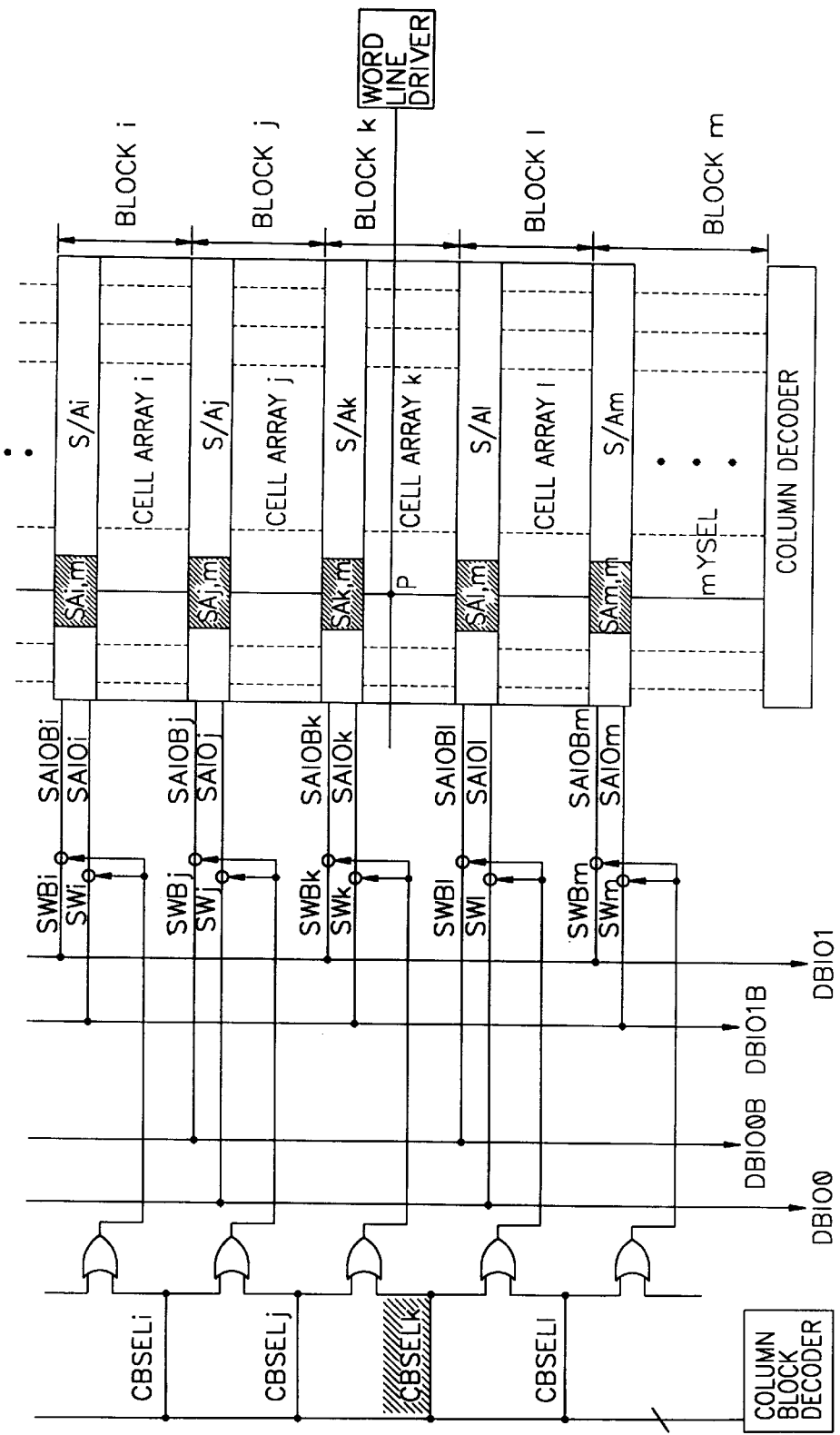
FIG. 1 is a schematic block diagram of a conventional semiconductor memory.
Figure 3:
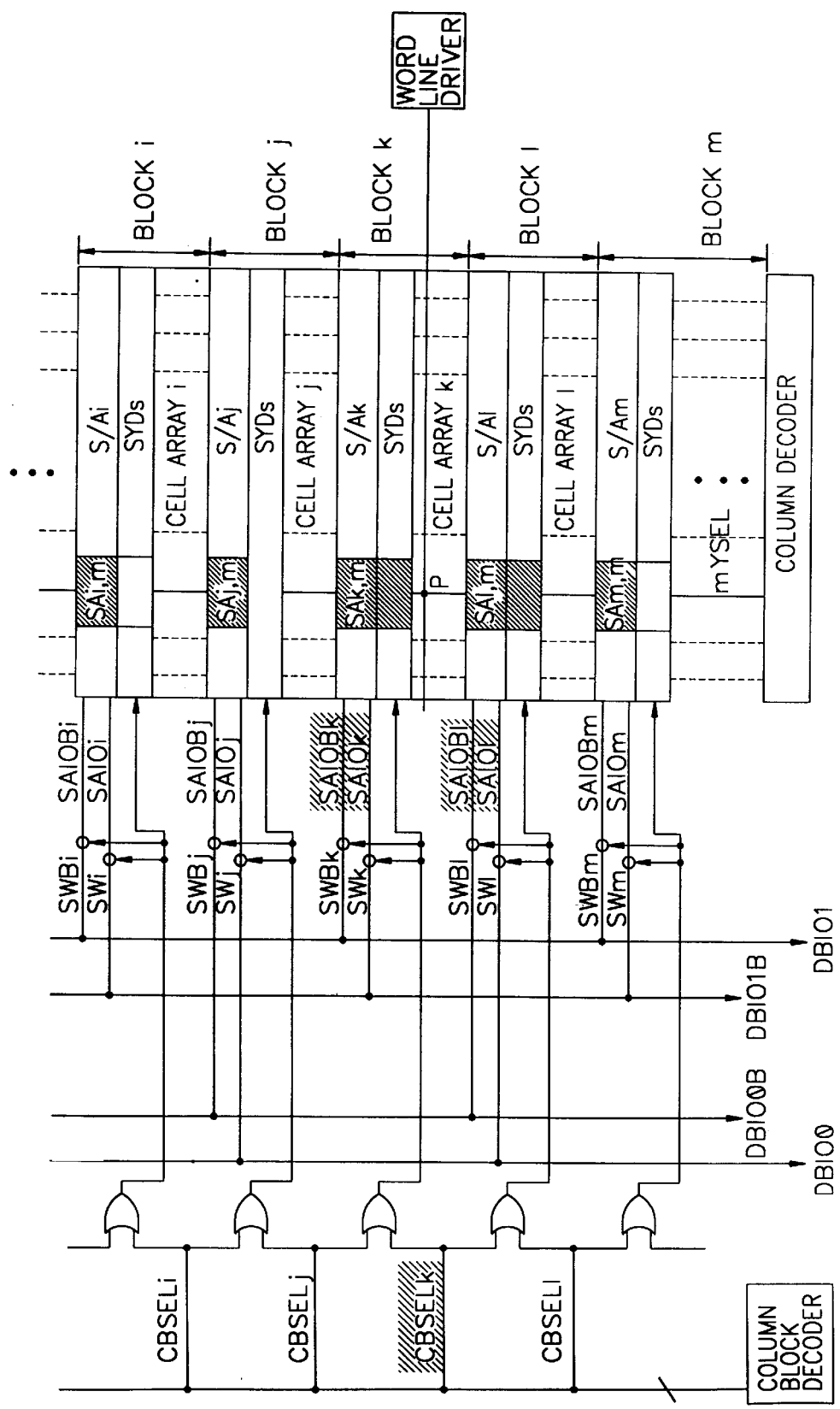
FIG. 3 is a block diagram of a semiconductor memory according to the present invention.

FIG. 3 illustrates a block diagram of a semiconductor memory according to the present invention. As shown, the structure of the semiconductor memory is the same as that shown in FIG. 1 except for the provision of sense amplifier drivers SYD associated with each sense amplifier SA.

Figure 4:
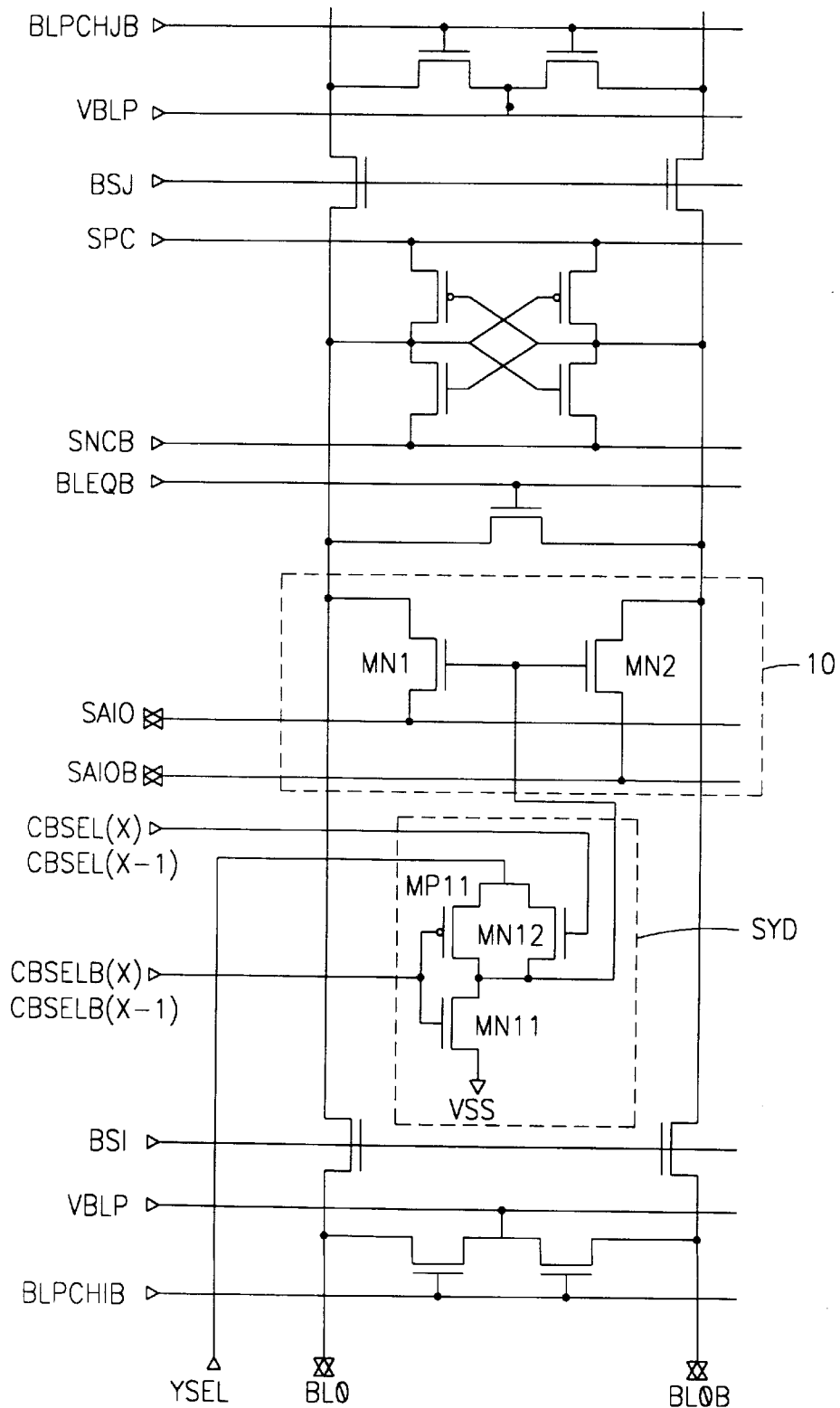
FIG. 4 is a circuit diagram of a sense amp and sense amp driver according to an embodiment of the present invention.

FIG. 4 illustrates a circuit diagram of a sense amplifier SA according to the present invention which incorporates a sense amplifier driver SYD. It should be understood, however, that the sense amplifier driver SYD does not need to be incorporated in the sense amplifier SA.

Figure 2:
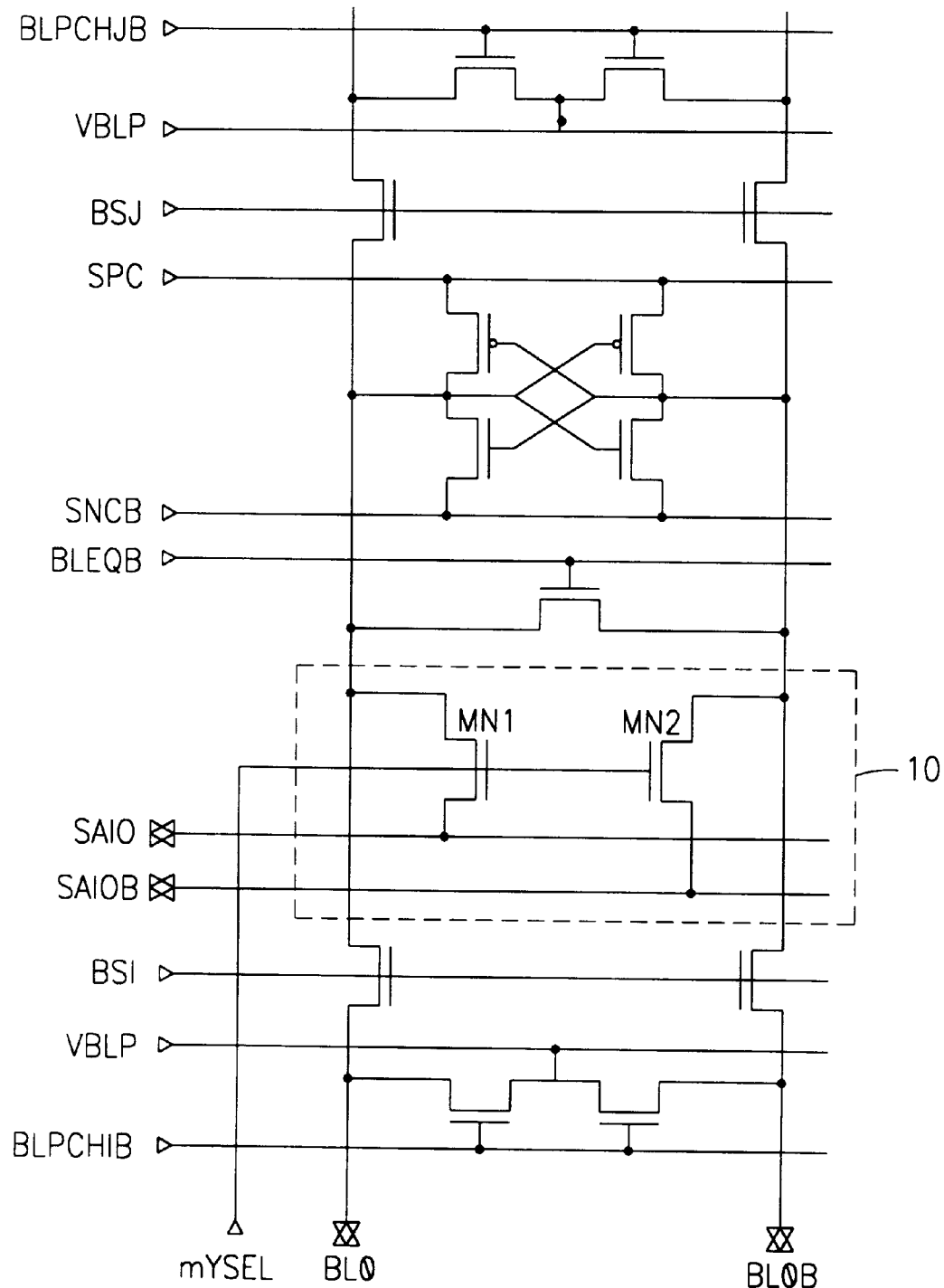
FIG. 2 is a circuit diagram of each sense amp in FIG. 1.

As shown in FIG. 4, the sense amplifier SA has the same structure as the conventional sense amplifier SA shown in FIG. 2 except for the addition of the sense amplifier driver SYD and that the first and second NMOS transistors MN1 and MN2 connect the bit and bit bar lines BL0 and BL0B to the S/A and inverse S/A local input/output lines SAIO and SAIOB, respectively, in response to a control signal from the sense amplifier driver SYD. The sense amplifier driver SYD generates the control signal based on the column address selecting signal YSEL, the column block selecting signal CBSEL(x) and CBSEL(x-1) for the associated sense amp array S/A(x) and the previous sense amp array S/A(x-1), and the inverses of these column block selecting signals CBSELB(x) and CBSELB(x-1). While the sense amp driver SYD in this and the later described embodiments receive the inverses of previously described signals, the inverters required to generate these inverse signals have not been illustrated for the sake of clarity, but one skilled in the art will readily understand from the disclosure that these inverters exist.

The sense amplifier driver SYD includes a first PMOS transistor MP11 and a third NMOS transistor MN11 connected in series between receipt of the column address selecting signal YSEL and a ground voltage VSS. Both the first PMOS and the third NMOS transistors MP11 and MN11 receive the inverse column block selecting signals CBSEL(x) and CBSEL(x-1) at their gates. A fourth NMOS transistor MN12 is connected in parallel with the first PMOS transistor MP11, and receives the column block selecting signals CBSEL(x) and CBSEL(x-1) at its gate. The interconnection between the first PMOS, third NMOS and fourth NMOS transistors MP11, MN11, and MN12 is connected to the gates of the first and second NMOS transistors MN1 and MN2.

Next the operation of the sense amplifier driver SYD and the bit line connecting circuit 10 illustrated in FIG. 4 will be described. More specifically, for the purposes of discussion, the operation of the sense amplifier SAk,m will be described.

Figure 5:
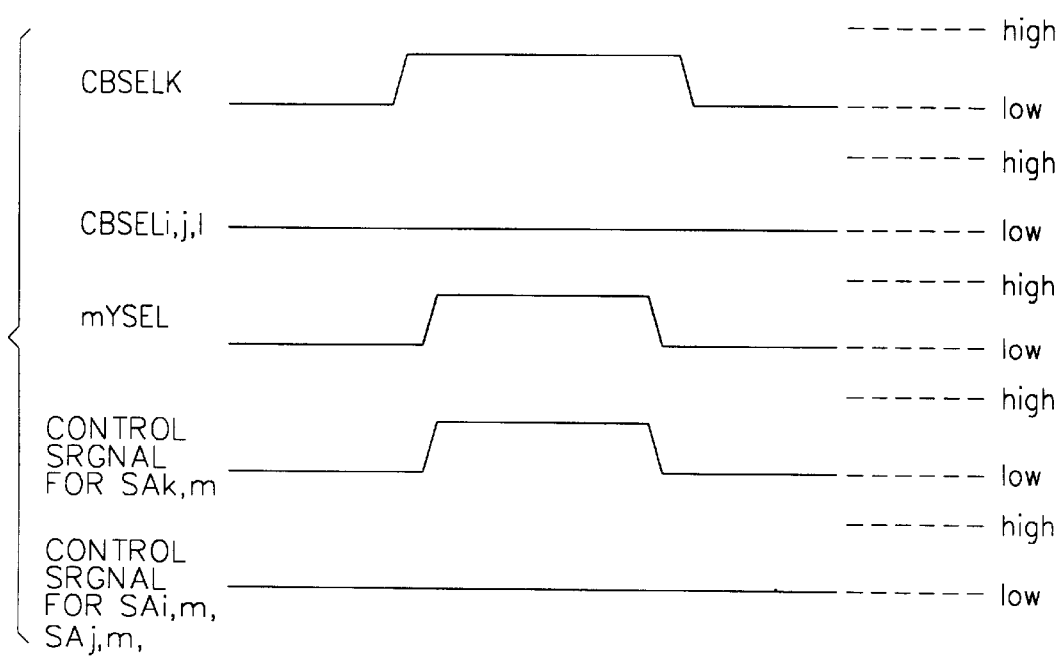
FIG. 5 illustrates the waveforms of signals generated in the semiconductor memory of FIG. 3.

As shown in FIG. 5, the column block selecting signal CBSELk for the kth sense amplifier array S/Ak goes high when the kth memory cell array includes the memory cell identified by a received memory cell address, and the other column block selecting signals remain low. As a result, the kth inverse column block selecting signal CBSELBk will be low, and the first PMOS transistor MP11 and the fourth NMOS transistor MN12 turn on and transfer the mth column address selecting signal mYSEL to the gates of the first and second NMOS transistor MN1 and MN2. If the memory cell address indicates that the memory cell is in the mth column, then the column address decoder will have output a logic high level mth column address selecting signal mYSEL as shown in FIG. 5, and the other column address selecting signals will remain low. Consequently, the first and second NMOS transistors MN1 and MN2 receive a logic high control signal as shown in FIG. 5, turn on and connect the bit and bit bar lines BL0 and BL0B to the S/A and inverse S/A local input/output lines SAIOk and SAIOBk. However, if the mth column address selecting signal mYSEL is logic low, then the first and second NMOS transistors NM1 and NM2 will not turn on regardless of the state of the kth and jth column block selecting signals CBSELk and CBSELj.

The sense amplifier driver SYD will operate in the same manner if the column block decoder outputs a logic high jth column block selecting signal CBSELj because the OR-gate array supplies the kth and jth column block selecting signals CBSELk and CBSELj to the sense amplifier drivers SYDs for the kth sense amplifier array S/Ak.

However, the column block decoder only generates a logic high column block selecting signal for the memory cell array including the memory cell specified in the received memory address. Therefore, the other column block selecting signals are logic low. If neither the kth or jth column block selecting signals CBSELk and CBSELj are logic high, then the first PMOS transistor MP11 and the fourth NMOS transistor MN12 do not turn on. Instead, the kth inverse column block selecting signal CBSELk will be logic high, and the third NMOS transistor MN11 turns on. This pulls the gates of the first and second NMOS transistors MN1 and MN2 to ground. Accordingly, the first and second NMOS transistors MN1 and MN2 are off, and the bit and bit bar lines BL0 and BL0B are not connected to the S/A local input/output lines SAIOk and SAIOBk.

Regardless of whether the mth column address selecting signal mYSEL has been driven high by the column decoder, the bit and bit bar lines BL0 and BL0B are not connected to the S/A local input/output lines SAIOk and SAIOBk. Consequently, only the two sense amplifiers in the column driven by the column decoder and adjacent to the memory cell array containing the memory cell identified in the memory cell address operate. This significantly reduces the amount of current consumption in the memory.

FIGS. 6A–6H illustrate other embodiments of the sense amp driver SYD according to the present invention. Like the embodiment of FIG. 4, these sense amp drivers SYD will be described as the sense amp driver SYD for the sense amp SA in the mth column and kth sense amp array S/Ak.

Figure 6A:
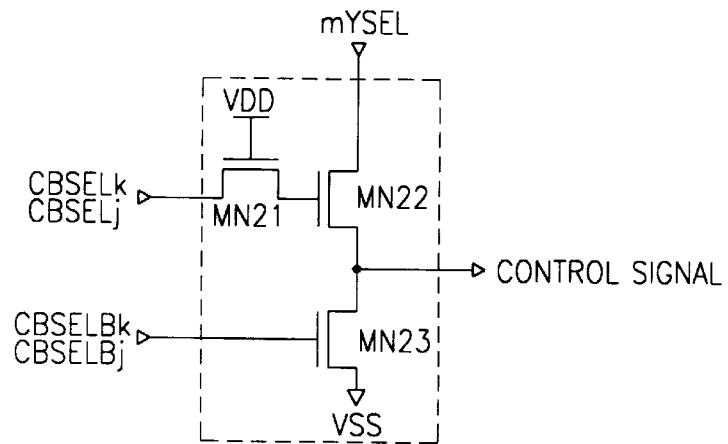
FIGS. 6A–6H are respective circuit diagrams illustrating other embodiments of a sense amplifier driver SYD according to the present invention.

According to the embodiment of FIG. 6A, the sense amp driver includes a fifth and sixth NMOS transistor MN22 and MN23 connected in series between receipt of the mth column address selection signal mYSEL and a ground voltage VSS. A seventh NMOS transistor MN21 is connected between receipt of the kth and jth column block selecting signals CBSELk, CBSELj (albeit via the OR gate array) and the gate of the fifth NMOS transistor MN22. The gate of the seventh NMOS transistor MN21 is connected to a power source voltage VDD. The sixth NMOS transistor MN23 receives the kth and jth inverse column block selecting signals CBSELBk, CBSELBj at its gate, and the connection between the fifth and sixth NMOS transistors MN22 and MN23 supplies the control signal.

By the connection of its gate to the power source voltage, the seventh NMOS transistor MN21 is always on, and the kth and jth column block selecting signals CBSELk, CBSELj are supplied to the gate of the fifth NMOS transistor MN22. Accordingly, the fifth NMOS transistor MN22 only causes the mth column address selecting signal mYSEL to be output as the control signal when the one of the kth and jth column block selecting signals CBSELk, CBSELj indicates the memory cell identified in the memory address is in the kth or jth memory cell array. Furthermore, the first and second NMOS transistors MN1 and MN2 will only turn on when the mth column address selecting signal mYSEL is high. If the kth and jth column block selecting signals CBSELk and CBSELj are low, the control signal is pulled to logic low by the sixth NMOS transistor MN23 regardless of the state of the mth column address selecting signal mYSEL.

Figure 6B:
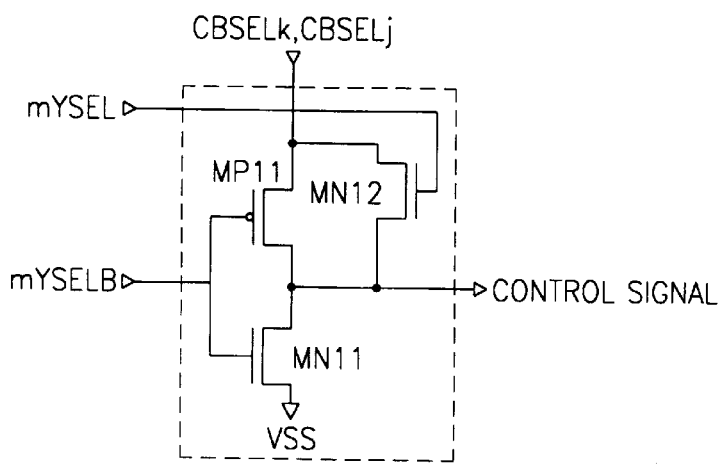

The embodiment of sense amp driver SYD in FIG. 6B has the same structure as the embodiment of FIG. 4 except that different signals are applied to the first PMOS, third NMOS and fourth NMOS transistors MP11, MN11 and MN12. Specifically, the kth and jth column block selecting signals CBSELk, CBSELj are applied to the source of the first PMOS transistor MP11 and applied to the drain of the fourth NMOS transistor MN12; the mth column address selecting signal mYSEL is applied to the gate of the fourth NMOS transistor MN12; and the mth inverse column address selecting signal mYSELB is applied to the gate of the third NMOS transistor MN11. The operation of the sense amp driver SYD illustrated in FIG. 6B will be readily apparent from the description of the previously discussed sense amp driver SYD embodiments; and therefore, for the sake of brevity, will not be described.

Figure 6C:
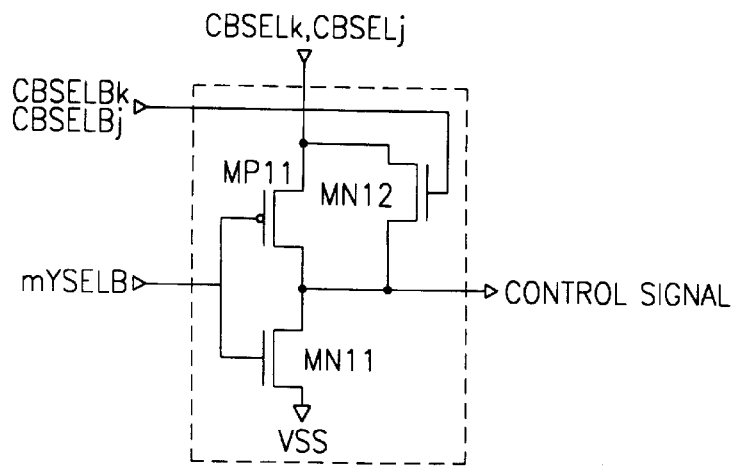

The embodiment of sense amp driver SYD in FIG. 6C has the same structure and receives the same signals as the embodiment of FIG. 6B except that the fourth NMOS transistor MN12 receives the kth and jth inverse column block selecting signal CBSELBk and CBSELBj at its gate instead of the mth column address selecting signal mYSEL. In this embodiment, when one of the kth and jth column block selecting signals CBSELk and CBSELj is high and mth column address selecting signal is high, the high one of the kth and jth column block selecting signals CBSELk and CBSELj is output as the control signal via the first PMOS transistor MP11. But, if the kth and jth column block selecting signals CBSELk and CBSELj are logic low, this logic low signal is output as the control signal via the fourth NMOS transistor MN12 regardless of the state of the mth column address selecting signal mYSEL. Similarly, if the mth column address selecting signal mYSEL is logic low, the third NMOS transistor MN11 pulls the control signal down to a logic low state regardless of the states of the kth and jth column block selecting signals CBSELk and CBSELj.

Figure 6D:
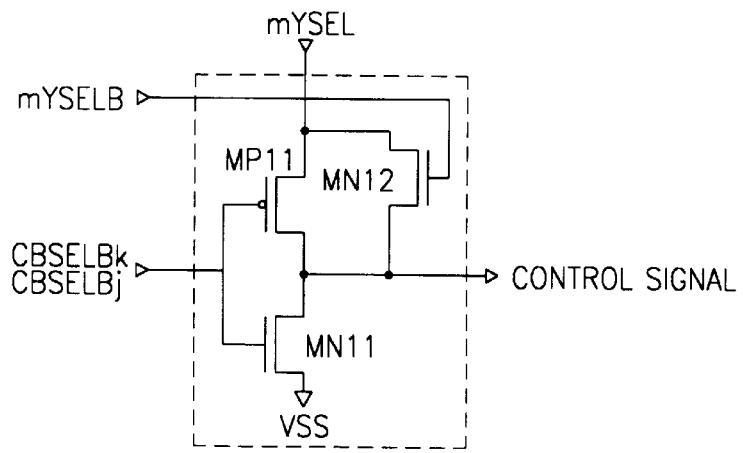

The embodiment of the sense amp driver SYD in FIG. 6D has the same structure as the sense amp driver in FIG. 4 except for the signals applied to the first PMOS, third NMOS and fourth NMOS transistors MP11, MN11 and MN12. Specifically, the mth column address selecting signal mYSEL is applied to the source of the first PMOS transistor MP11 and to the drain of the fourth NMOS transistor MN12; the mth inverse column address selecting signal mYSELB is applied to the gate of the fourth NMOS transistor MN12; and the kth and jth inverse column block selecting signals CBSELBk and CBSELBj are applied to the gates of the first PMOS transistor MP1 I and the third NMOS transistor MN11. The operation of the sense amp driver SYD illustrated in FIG. 6D will be readily apparent from the description of the previously discussed sense amp driver SYD embodiments, particularly the embodiment of FIG. 6C; and therefore, for the sake of brevity will not be described.

Figure 6E:
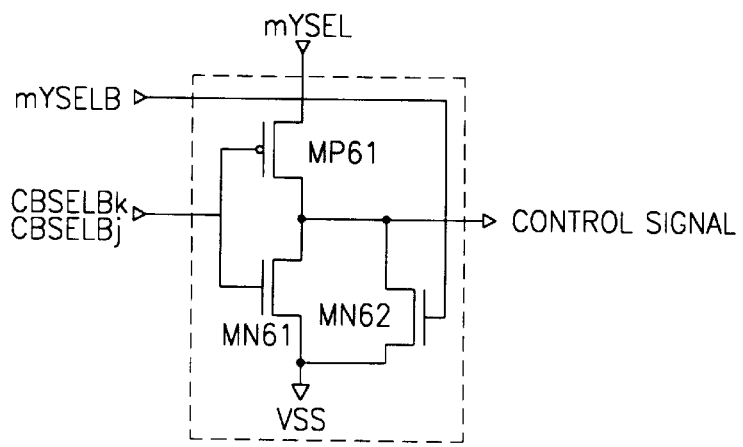

The sense amp driver SYD embodiment of FIG. 6E has a different structure than that of FIG. 4. As shown, the sense amp driver SYD of FIG. 6E includes a second PMOS transistor MP61 and an eighth NMOS transistor MN61 connected in series between receipt of the mth column address selecting signal mYSEL and a ground voltage VSS. Both the second PMOS and the eighth NMOS transistors MP61 and MN61 receive the kth and jth inverse column block selecting signals CBSELBk, CBSELBj at their gates. A ninth NMOS transistor MN62 is connected in parallel with the eighth NMOS transistor MN61, and receives the mth inverse column address selecting signal mYSEL at its gate. The interconnection between the second PMOS, eighth NMOS and ninth NMOS transistors MP61, MN61, and MN62 supplies the control signal.

When the mth column address selecting signal mYSEL is logic high and one of the kth and jth column block selecting signals CBSELk, CBSELj is logic high, the logic high mth column selecting address signal mYSEL is output as the control signal to turn on the first and second NMOS transistors MN1 and MN2. If, however, both the kth and jth column block selecting signals CBSELk, CBSELj are logic low, then the control signal is pulled down to ground by the eighth NMOS transistor MN61 regardless of the state of the mth column address selecting signal mYSEL. Similarly, if the mth column address selecting signal mYSEL is logic low, then the ninth NMOS transistor MN62 pulls the control signal down to ground regardless of the state of the kth and jth column block selecting signals CBSELk, CBSELj.

Figure 6F:
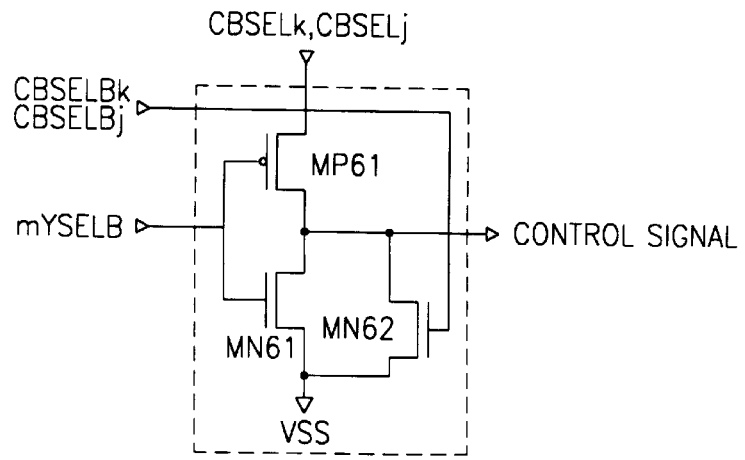

The embodiment of the sense amp driver SYD in FIG. 6F has the same structure as the embodiment of FIG. 6E except that different signals are applied to the second PMOS, eighth NMOS and ninth NMOS transistors MP61, MN61 and MN62. Specifically, the kth and jth column block selecting signals CBSELk, CBSELj are applied to the source of the second PMOS transistor MP61; the mth inverse column address selecting signal mYSELB is applied to the gates of the second PMOS transistor MP61 and the eighth NMOS transistor MN61; and the kth and jth inverse column block selecting signals CBSELBk, CBSELBj are applied to the gate of the ninth NMOS transistor MN62. The operation of the sense amp driver SYD illustrated in FIG. 6F will be readily apparent from the description of the previously discussed sense amp driver embodiments; and therefore, for the sake of brevity will not be described.

Figure 6G:
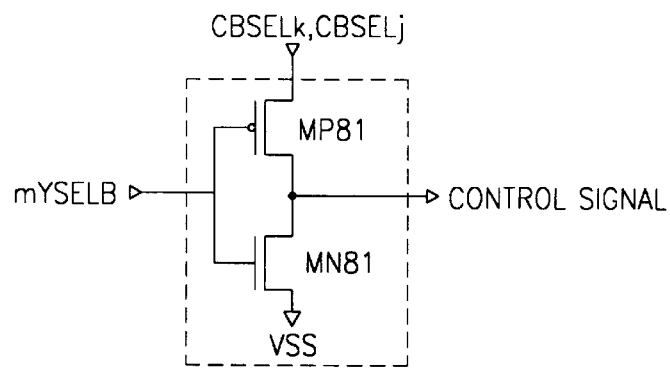

The structure of the embodiment of the sense amp driver SYD in FIG. 6G is different from that of the sense amp driver SYD in FIG. 4. As shown, the embodiment of FIG. 6G includes a third PMOS transistor MP81 and a tenth NMOS transistor MN81 connected in series between the receipt of the kth and jth column block selecting signals CBSELk, CBSELj and a ground voltage VSS. The gates of the third PMOS transistor MP81 and the tenth NMOS transistor MN81 receive the mth inverse column address selecting signal mYSELB, and the connection between the third PMOS transistor MP81 and the tenth NMOS transistor MN81 output the control signal.

When the mth column address selecting signal mYSEL is logic high and one of the kth and jth column block selecting signals CBSELk, CBSELj is logic high, the logic high one of the kth and jth column block selecting signals CBSELk, CBSELj is output via the third PMOS transistor MP81 as the control signal to turn on the first and second NMOS transistors MN1 and MN2. If however, both the kth and jth column block selecting signals CBSELk, CBSELj are logic low, then the control signal is logic low regardless of the state of the mth column address selecting signal mYSEL. Similarly, if the mth column address selecting signal mYSEL is logic low, then the tenth NMOS transistor MN81 pulls the control signal down to ground regardless of the state of the kth and jth column block selecting signals CBSELk, CBSELj.

Figure 6H:
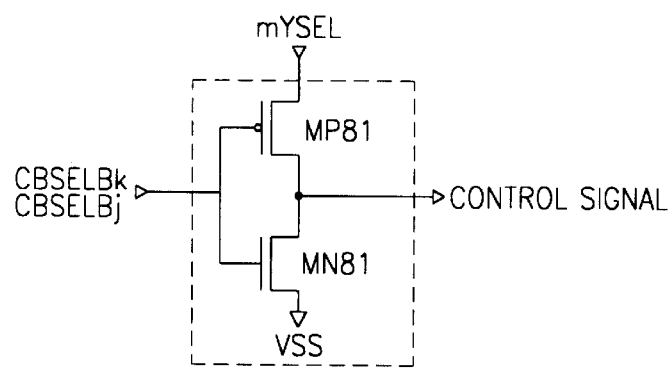

The embodiment of sense amp driver SYD in FIG. 6H has the same structure as the embodiment of FIG. 6G except that different signals are applied to the third PMOS transistor MP81 and the tenth NMOS transistors MN81. As shown, the source of the third PMOS transistor 81 receives the mth column address selecting signal mYSEL, and the gates of the third PMOS transistor MP81 and the tenth NMOS transistor MN81 receive the kth and jth inverse column block selecting signals CBSELBk, CBSELBj. The operation of the sense amp driver SYD illustrated in FIG. 6H will be readily apparent from the description of the previously discussed sense amp driver embodiments; and therefore, for the sake of brevity will not be described.

Figure 7:
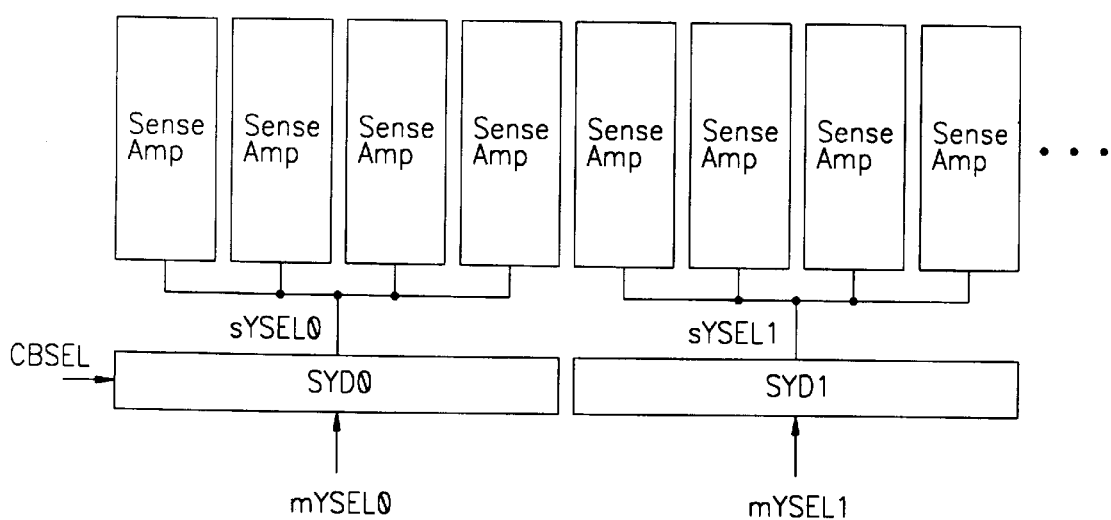
FIG. 7 is a block diagram illustrating another embodiment of the semiconductor memory according to the present invention.

FIG. 7 shows a modification to the semiconductor memory shown in FIG. 3. In the embodiment of FIG. 7, a single sense amp driver SYD supplies a control signal to a plurality of sense amps SAs. Accordingly, the column decoder generates a logic high column address signal for the sense amp drivers SYDs controlling sense amps SAs, one of which corresponds to the column containing a memory cell identified in a received memory cell address. As a result, this embodiment reduces the number of sense amp drivers SYDs, and therefore, the circuit size of the semiconductor memory.

Figure 8:
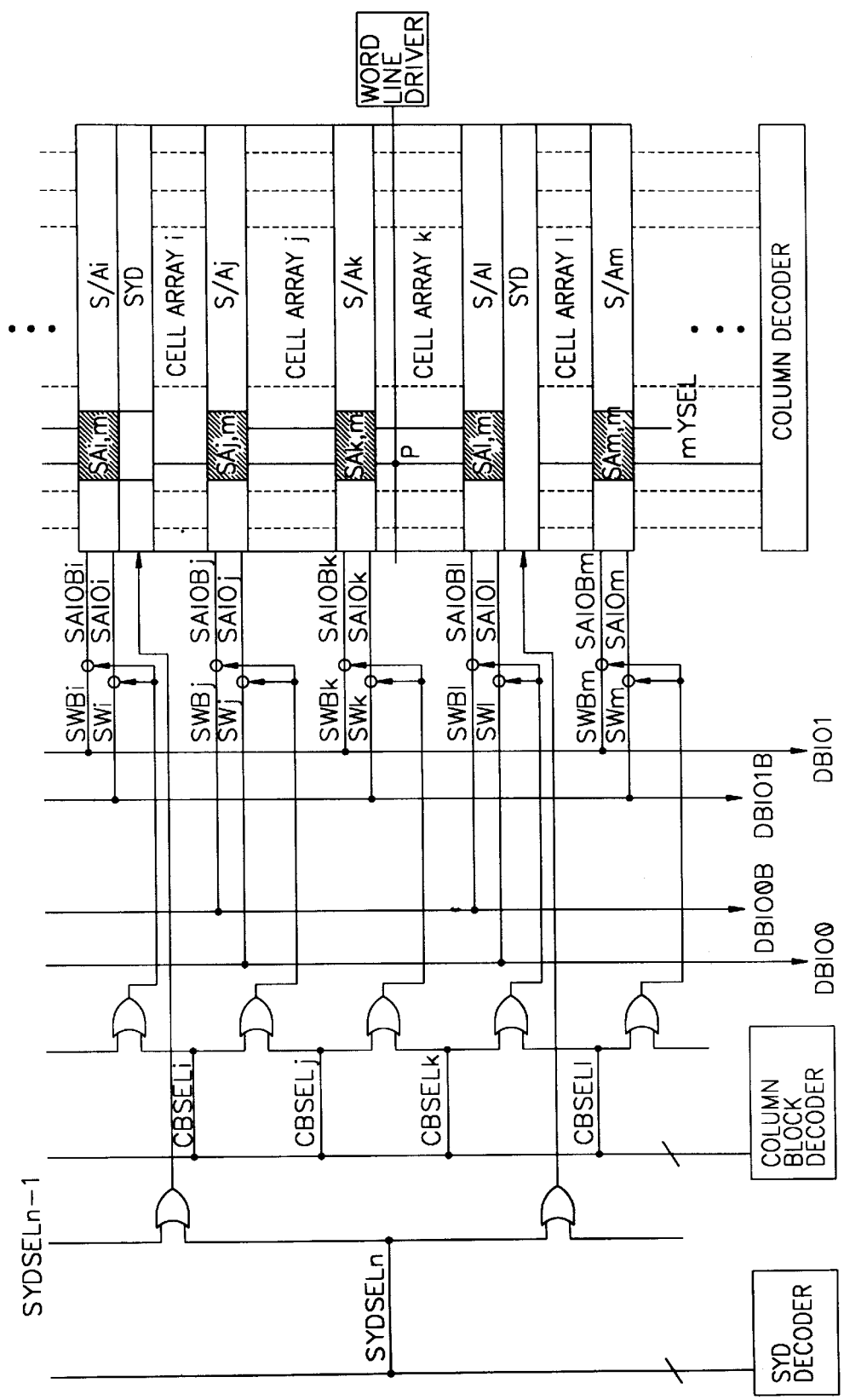
FIG. 8 is a block diagram illustrating still another embodiment of the semiconductor memory according to the present invention.

FIG. 8 illustrates a further embodiment of the semiconductor memory according to the present invention. The structure of the semiconductor memory of FIG. 8 is the same as FIG. 3 except for (1) the addition of an SYD decoder and another OR-gate array, (2) that a single sense amp driver SYD drives the sense amps SAs in several sense amp arrays S/As, and (3) that the sense amp drivers SYDs receive SYD selecting signals from the SYD decoder instead of the column block selecting signals CBSEL from the column block decoder. In this embodiment, the sense amps SAs in several sense amp arrays S/As are connected to a single sense amp driver SYD. An SYD decoder generates SYD selecting signals corresponding to each group of several sense amp arrays S/As based on the bank address. An SYD selecting signal will have a logic high state if the memory cell identified in the received memory address is in one of the memory cell arrays corresponding to the group of several sense amp arrays S/As associated with the SYD selecting signal. The second OR-gate array supplies the xth and the (x-th) SYD selecting signals to the xth sense amp driver SYD. The SYD selecting signals are applied to the sense amp drivers SYDs in place of the column block selecting signals. Accordingly, the sense amp drivers SYDs operate in the same manner as discussed above; and therefore, that description will not be repeated.

As described above, the present invention has several advantages. First, the first and second NMOS transistors MN1 and MN2 of a sense amp SA are controlled based on the column-block selecting signal or an SYD selecting signal. This allows control over the operation of individual sense amps or groups of sense amps, and thus a reduction in current consumption. Furthermore, by diminishing the loading of the main column-address selecting signal, the operating speed of the system can be improved. Finally, the detrimental effects caused by current leaking into the S/A and inverse S/A local input/output lines of the S/A arrays is reduced.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A semiconductor memory device, comprising:
 a plurality of memory cell arrays;
 a sense amplifier array corresponding to each memory cell array, each sense amplifier array including a plurality of sense amplifiers, each sense amplifier associated with a column of memory cells in a corresponding memory cell array and including a bit line and a bit bar line, the bit and bit bar lines being for loading data stored in a memory cell;
 input/output lines corresponding to each sense amplifier array;

a plurality of sense amplifier drivers, each sense amplifier driver associated with at least one sense amplifier and selectively causing the bit and bit bar lines of the associated sense amplifier to be connected with the corresponding input/output lines based on at least one of a column address selecting signal and an inverse of the column address selecting signal and at least one of a column group selecting signal and an inverse of the column group selecting signal;

a column decoder decoding a column address signal, indicating a column address of a selected memory cell, to generate the column address selecting signal; and a decoder generating the column group selecting signal indicating at least a memory cell array containing the selected memory cell.

2. The device of claim 1, wherein each sense amplifier driver is associated with a different one of the sense amplifiers.

3. The device of claim 2, wherein the column group selecting signal indicates the memory cell array containing the selected memory cell.

4. The device of claim 3, wherein each sense amplifier driver connects the bit and bit bar lines of the associated sense amplifier to the corresponding input/output lines when the column group selecting signal indicates the memory cell array corresponding to the associated sense amplifier and the column address selecting signal indicates the column of memory cells associated with the associated sense amplifier.

5. The device of claim 1, wherein each sense amplifier driver is associated with more than one sense amplifier in a sense amplifier array.

6. The device of claim 5, wherein the column group selecting signal indicates the memory cell array containing the selected memory cell.

7. The device of claim 6, wherein each sense amplifier driver connects the bit and bit bar lines of the associated sense amplifiers to the corresponding input/output lines when the column group selecting signal indicates the memory cell array corresponding to the associated sense amplifiers and the column address selecting signal indicates the column of memory cells associated with one of the associated sense amplifiers.

8. The device of claim 1, wherein each sense amplifier driver is associated with the sense amplifiers in at least one sense amplifier array.

9. The device of claim 8, wherein each sense amplifier driver is associated with the sense amplifiers in more than one sense amplifier array.

10. The device of claim 9, wherein the column group selecting signal indicates a block of memory cell arrays, one of which contains the selected memory cell.

11. The device of claim 10, wherein each sense amplifier driver connects the bit and bit bar lines of the associated sense amplifiers to the corresponding input/output lines when the column group selecting signal indicates the block of memory cell arrays including a memory cell array corresponding to at least one of the associated sense amplifiers and the column address selecting signal indicates the column of memory cells associated with one of the associated sense amplifiers.

12. The device of claim 10, further comprising:

data bus lines;

a set of switches corresponding to the input/output line for each sense amplifier array, each set of switches selectively connecting the corresponding input/output lines to the data bus lines based on a column block selecting signal; and a column block decoder generating the column block selecting signal, the column block selecting signal indicating the memory cell array including the selected memory cell.

13. The device of claim 1, wherein the column group selecting signal indicates the memory cell array containing the selected memory cell.

14. The device of claim 13, wherein each sense amplifier driver connects the bit and bit bar lines of the associated sense amplifier to the corresponding input/output lines when the column group selecting signal indicates the memory cell array corresponding to the associated sense amplifier and the column address selecting signal indicates the column of memory cells associated with the associated sense amplifier.

15. The device of claim 1, further comprising:

data bus lines;

a set of switches corresponding to the input/output lines for each sense amplifier array, each set of switches selectively connecting the corresponding input/output lines to the data bus lines based on the column group selecting signal.

16. The device of claim 1, further comprising:

data bus lines;

a set of switches corresponding to the input/output lines for each sense amplifier array, each set of switches selectively connecting the corresponding input/output lines to the data bus lines based on a column block selecting signal; and a column block decoder generating the column block selecting signal, the column block selecting signal indicating the memory cell array including the selected memory cell.

17. The device of claim 1, wherein each sense amplifier driver comprises:

a PMOS transistor having a first gate, first drain and first source, the first source receiving the column address selecting signal and the first gate receiving the inverse column group selecting signal;

a first NMOS transistor having a second gate, second drain and second source, the second drain connected to the first drain, the second source connected to a ground voltage, and the second gate receiving the inverse column group selecting signal; and a second NMOS transistor having a third gate, third drain and third source, the third drain receiving the column address selecting signal, the third gate receiving the column group selecting signal, the third source connected to the first and second drains, and the connection of the third source and the first and second drains supplying a control signal to the associated sense amplifier to control whether the bit and bit bar lines thereof are connected to the corresponding input/output lines.

18. The device of claim 1, wherein each sense amplifier driver comprises:

a first NMOS transistor having a first gate, first source and first drain, the first drain receiving the column group selecting signal, and the first gate connected to a logic high reference voltage;

a second NMOS transistor having a second gate, second source and second drain, the second drain receiving the column address selecting signal, and the second gate connected to the first source; and a third NMOS transistor having a third gate, third source and third drain, the third drain connected to the second source, the third source connected to a ground voltage, the third gate receiving the inverse column group selecting signal, and the connection of the second source and the third drain supplying a control signal to the associated sense amplifier to control whether the bit and bit bar lines thereof are connected to the corresponding input/output lines.

19. The device of claim 1, wherein each sense amplifier driver comprises:

a PMOS transistor having a first gate, first drain and first source, the first source receiving the column group selecting signal and the first gate receiving the inverse column address selecting signal;

a first NMOS transistor having a second gate, second drain and second source, the second drain connected to the first drain, the second source connected to a ground voltage, and the second gate receiving the inverse column address selecting signal; and a second NMOS transistor having a third gate, third drain and third source, the third drain receiving the column group selecting signal, the third gate receiving the column address selecting signal, the third source connected to the first and second drains, and the connection of the third source and the first and second drains supplying a control signal to the associated sense amplifier to control whether the bit and bit bar lines thereof are connected to the corresponding input/output lines.

20. The device of claim 1, wherein each sense amplifier driver comprises:

a PMOS transistor having a first gate, first drain and first source, the first source receiving the column group selecting signal and the first gate receiving the inverse column address selecting signal;

a first NMOS transistor having a second gate, second drain and second source, the second drain connected to the first drain, the second source connected to a ground voltage, and the second gate receiving the inverse column address selecting signal; and a second NMOS transistor having a third gate, third drain and third source, the third drain receiving the column group selecting signal, the third gate receiving the inverse column group selecting signal, the third source connected to the first and second drains, and the connection of the third source and the first and second drains supplying a control signal to the associated sense amplifier to control whether the bit and bit bar lines thereof are connected to the corresponding input/output lines.

21. The device of claim 1, wherein each sense amplifier driver comprises:

a PMOS transistor having a first gate, first drain and first source, the first source receiving the column address selecting signal and the first gate receiving the inverse column group selecting signal;

a first NMOS transistor having a second gate, second drain and second source, the second drain connected to the first drain, the second source connected to a ground voltage, and the second gate receiving the inverse column group selecting signal; and a second NMOS transistor having a third gate, third drain and third source, the third drain receiving the column address selecting signal, the third gate receiving the inverse column address selecting signal, the third source connected to the first and second drains, and the connection of the third source and the first and second drains supplying a control signal to the associated sense amplifier to control whether the bit and bit bar lines thereof are connected to the corresponding input/output lines.

22. The device of claim 1, wherein each sense amplifier driver comprises:

a PMOS transistor having a first gate, first drain and first source, the first source receiving the column address selecting signal and the first gate receiving the inverse column group selecting signal;

a first NMOS transistor having a second gate, second drain and second source, the second drain connected to the first drain, the second source connected to a ground voltage, and the second gate receiving the inverse column group selecting signal; and a second NMOS transistor having a third gate, third drain and third source, the third drain connected to the first and second drains, the third gate receiving the inverse column address selecting signal, the third source connected to the ground voltage, and the connection of the first, second and third drains supplying a control signal to the associated sense amplifier to control whether the bit and bit bar lines thereof are connected to the corresponding input/output lines.

23. The device of claim 1, wherein each sense amplifier driver comprises:

a PMOS transistor having a first gate, first drain and first source, the first source receiving the column group selecting signal and the first gate receiving the inverse column address selecting signal;

a first NMOS transistor having a second gate, second drain and second source, the second drain connected to the first drain, the second source connected to a ground voltage, and the second gate receiving the inverse column address selecting signal; and a second NMOS transistor having a third gate, third drain and third source, the third drain connected to the first and second drains, the third gate receiving the inverse column group selecting signal, the third source connected to the ground voltage, and the connection of the first, second and third drains supplying a control signal to the associated sense amplifier to control whether the bit and bit bar lines thereof are connected to the corresponding input/output lines.

24. The device of claim 1, wherein each sense amplifier driver comprises:

a PMOS transistor having a first gate, first drain and a first source, the first source receiving the column group selecting signal, and the first gate receiving the inverse column address selecting signal;

a first NMOS transistor having a second gate, second drain and second source, the second drain connected to the first drain, the second source connected to a ground voltage, and the second gate receiving the inverse column address selecting signal, the connection of the first and second drains supplying a control signal to the associated sense amp to control whether the bit and bit bar lines thereof are connected to the corresponding input/output lines.

25. The device of claim 1, wherein each sense amplifier driver comprises:

a PMOS transistor having a first gate, first drain and a first source, the first source receiving the column address selecting signal, and the first gate receiving the inverse column group selecting signal;

a first NMOS transistor having a second gate, second drain and second source, the second drain connected to the first drain, the second source connected to a ground voltage, and the second gate receiving the inverse column group selecting signal, the connection of the first and second drains supplying a control signal to the associated sense amp to control whether the bit and bit bar lines thereof are connected to the corresponding input/output lines.

* * * * *